United States Patent
Mizuuchi

(12) 
(10) Patent No.: US 6,201,263 B1
(45) Date of Patent: Mar. 13, 2001

(54) SEMICONDUCTOR DEVICE

(75) Inventor: Kenji Mizuuchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/213,421

(22) Filed: Dec. 17, 1998

(30) Foreign Application Priority Data

Jan. 7, 1998 (JP) .................................................. 10-001202

(51) Int. Cl.[7] .................................................. H01L 31/12
(52) U.S. Cl. .............................................. 257/80; 257/82
(58) Field of Search .................. 257/80, 81, 82

(56) References Cited

U.S. PATENT DOCUMENTS

| | | |
|---|---|---|
| 5,304,819 | 4/1994 | Torazawa et al. . |
| 5,554,881 * | 9/1996 | Koyasu .................................. 257/584 |
| 5,647,034 * | 7/1997 | Matsuda et al. ......................... 385/16 |
| 5,856,687 * | 1/1999 | Kimura .................................. 257/235 |
| 6,025,610 * | 2/2000 | Kusaka et al. ........................... 257/82 |

FOREIGN PATENT DOCUMENTS 0700 101A1    3/1996 (EP) .

OTHER PUBLICATIONS

Abstract–"Optically Coupled Type Field Effect Transistor Switch", K. Mizuuchi; Pub. Aug. 22, 1989, No. 01208015, Applicant Oki Electric Industry Co., Ltd, Japan.

Abstract–"Semiconductor Relay", Fukumori Minoru; Pub. Nov. 16, 1993, No. 05304312, Applicant Matsushita Electric Works Ltd., Japan.

"Advances in semiconductor Relays Squeeze Mechanical Versions from Market", Technology Closeup; 2209 JEE Journal of Electronic Engineering, 31 (1994) Jul. No. 331, Tokyo, JP; pp. 68–71.

* cited by examiner

*Primary Examiner*—David Hardy
(74) *Attorney, Agent, or Firm*—Rabin & Champagne, P.C.

(57) ABSTRACT

First and second MOS transistor elements, each having two source pads respectively arranged in the vicinity of two opposite corners and a gate pad arranged in the vicinity of a corner between these two corners, and a light receiving element arranged on a second terminal. In this way, wires respectively connecting gate pads of the first and second MOS transistor elements and the light receiving element are shortened. A source pad of the first MOS transistor element adjacent to the second terminal and the second terminal can be connected by a wire, so this wire can be shortened. A source pad of the second MOS transistor element adjacent to the second terminal and the second terminal can be connected by a wire, so this wire also can be shortened.

6 Claims, 4 Drawing Sheets

SEMICONDUCTOR DEVICE

BACKGROUND OF THE INVENTION

1. Field of the Invention

The present invention relates to a semiconductor device. Specifically, the present invention relates to a pad pattern of a vertical diffusion metal oxide semiconductor field effect transistor (hereinafter referred to as VDMOS) used in photocouplers.

2. Description of the Related Art

In a VDMOS, current flows from a drain on a rear surface of a semiconductor chip to an outside surface. A source pad and a gate pad are provided on the main surface. The source pad and gate pad are arranged in the center of the chip so as to be symmetrical, thereby taking into account uniformity of current flow and voltage.

A photo coupler (hereinafter referred to as a bidirectional MOS relay) comprises such a VDMOS, a photoelectromotive element (light receiving element), and an LED.

SUMMARY OF THE INVENTION

The object of the present invention is to bring about package thinning by reducing the length of wiring connecting a VDMOS and a light receiving element, and to provide a high quality semiconductor device.

In order to achieve the above objects, a semiconductor device of the present invention comprises a first terminal, a first light emitting element arranged on the first terminal, a second terminal, a second light receiving element arranged on the second terminal opposite the light emitting element, a third terminal, a fourth terminal, a first MOS transistor element and a second MOS transistor element, each having two source pads respectively arranged in the vicinity of two mutually opposite corners, and a gate pad arranged in the vicinity of a corner in between the two opposite corners, the first MOS transistor element being arranged on the third terminal and the second MOS transistor element being arranged on the fourth terminal, a plurality of wires respectively connecting the gate pads of the first and second MOS transistors to the light receiving elements, a wire connecting one of the source pads of the first MOS transistor element close to the second terminal to the second terminal, a wire connecting one of the source pads of the second MOS transistor element close to the second terminal and the second terminal, and a wire connecting the second light receiving element and the second terminal.

In order to solve the above described problems, various other aspects are included in the present invention, and will be described with reference to preferred embodiments.

BRIEF DESCRIPTION OF THE DRAWINGS

While the specification concluded with claims particularly pointing out and distinctly claiming the subject matter which is regarded as the invention, it is believed that the invention, the objects and features of the invention and further objects, features and advantages thereof will be better understood from the following description taken in connection with the accompanying drawings, in which:

DETAILED DESCRIPTION OF THE PREFERRED EMBODIMENTS

Each embodiment of the semiconductor device of the present invention will be described below with reference to the drawings.

Figure 1:
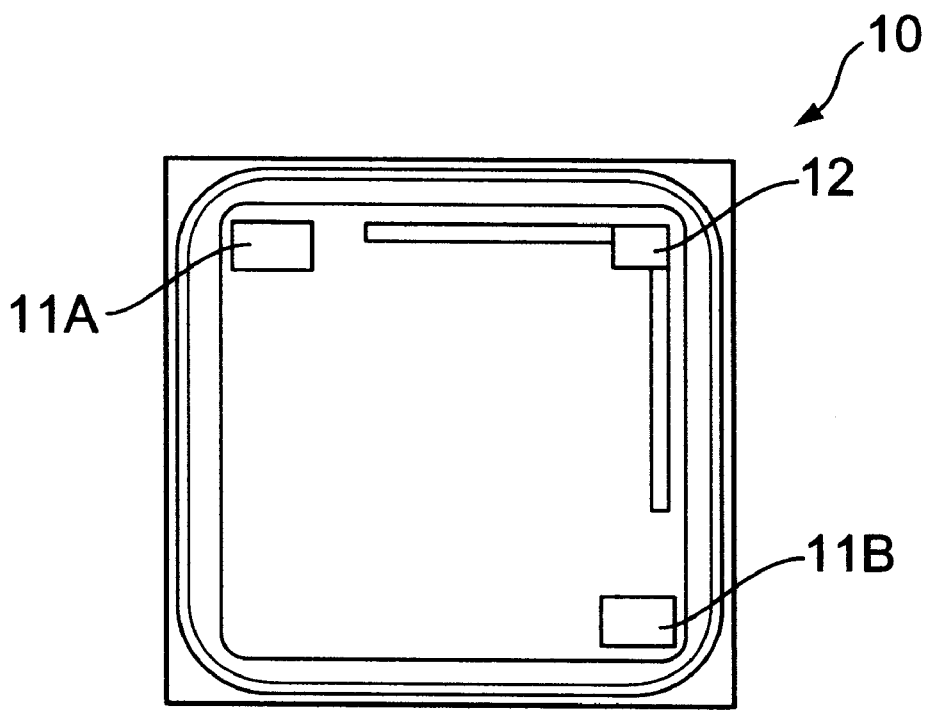
FIG. 1 is a drawing showing a pad pattern of a VDMOS of a first embodiment of the present invention.
Figure 2:
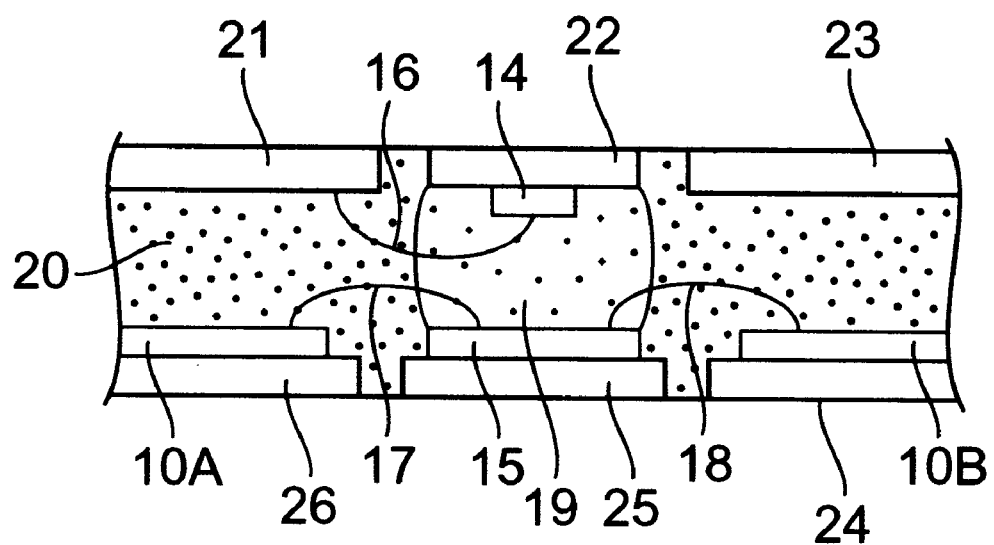
FIG. 2 is a cross sectional drawing of part of a bidirectional MOS relay using a VDMOS of the first embodiment.
Figure 3A:
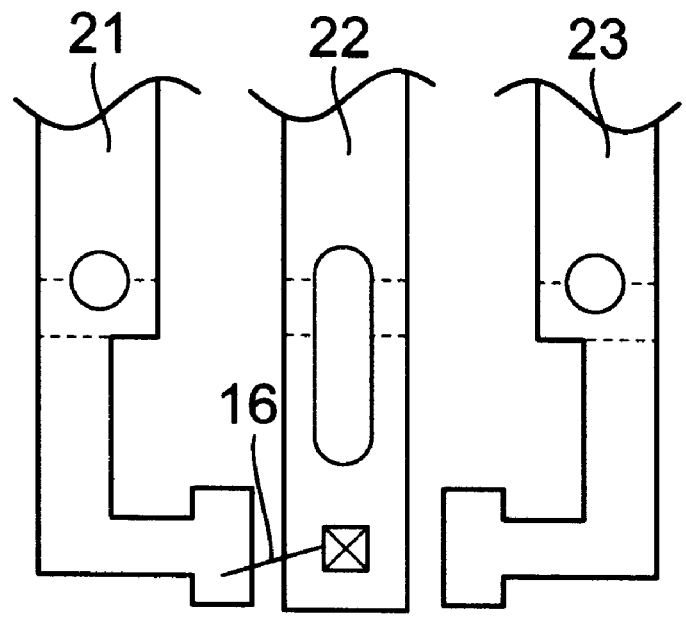
FIG. 3 (a) and FIG. 3 (b) are wiring diagrams of a bidirectional MOS relay using the VDMOS of the first embodiment.
Figure 3B:
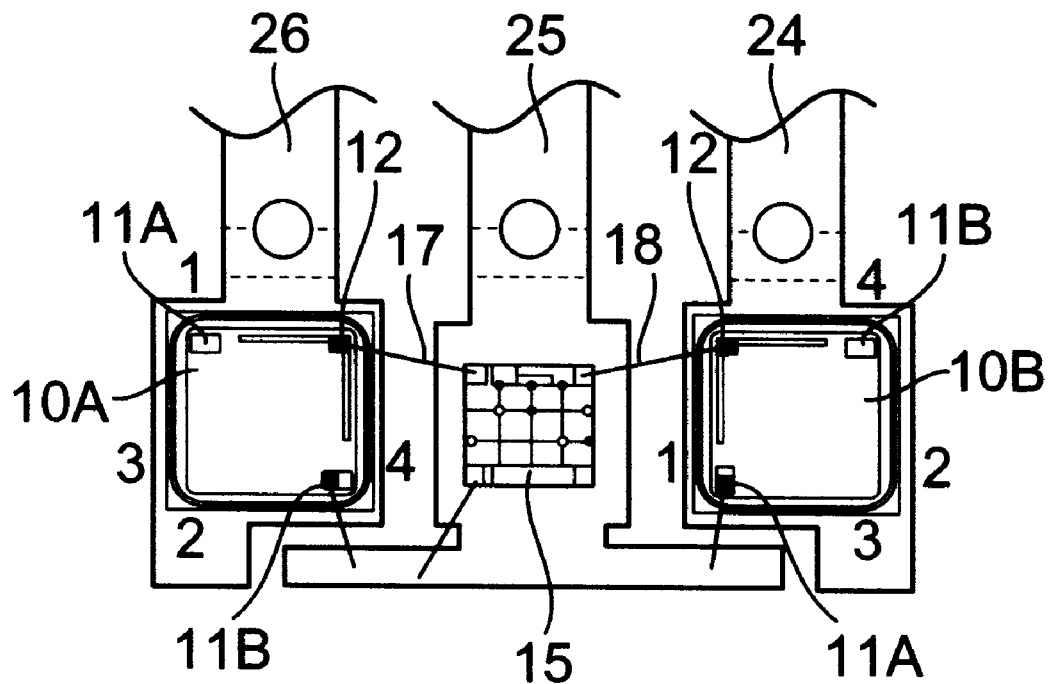

FIG. 1 is a drawing showing a pad pattern of a VDMOS of a first embodiment of the present invention. FIG. 2 is a cross-sectional drawing of part of a bidirectional MOS relay using VDMOS of the first embodiment. FIG. 3 (a) and FIG. 3 (b) are wiring diagrams of a bidirectional MOS relay using the VDMOS of the first embodiment.

FIG. 3 (a) is a wiring diagram of the light emitting side, while FIG. 3 (b) is a wiring diagram of the light receiving side.

The pad pattern of the VDMOS of the first embodiment will be described using FIG. 1. As shown in FIG. 1, the pad pattern of the VDMOS 10 has a source pad 11A, a gate pad 12 and a source pad 11B arranged close to three corners. The source pad 11A and the source pad 11B are arranged close to mutually opposite corners of the VDMOS 10. The gate pad 12 is arranged close to a corner in between these two corners.

A bidirectional MOS relay will now be described using FIG. 2 and FIGS. 3 (a) and 3 (b).

First of all, a description will be given of the light receiving side element.

As shown in FIG. 2 and FIGS. 3 (a) and 3 (b) in the bidirectional MOS relay using this VDMOS, VDMOS 10B (first MOS transistor element) and VDMOS 10B (second MOS transistor element) are respectively die bonded to the two terminals 26 and 24 of the light receiving side, and a photo electromotive element (light receiving element) is die bonded to terminal 25.

There is no variation in the directivity at the time of switching between the two VDMOS devices 10A and 10B, because they use the same wafer.

As shown in FIG. 3 (b), the pad pattern of the VDMOS 10A and the pad pattern of the VDMOS 10B are arranged symmetrically with respect to the light receiving element. The VDMOS 10A (or the VDMOS 10B) is rotated by 90° with respect to the VDMOS 10B (or the VDMOS 10A), and die bonded. The rotation by 90° and die bonding uses currently known die bonding as much as possible, and not difficult techniques, and can be simply controlled using software.

The gate pads of the VDMOS 10A and the VDMOS 10B are arranged so as to be close to the photo electromotive element 15. Each gate pad of the VDMOS 10A and the VDMOS 10B is connected to the photo electromotive element 15 by a wire. Of the two source pads of the VDMOS 10A, the source pad 11B close (closer) to the terminal 25 is connected to the terminal 25 by a wire. Of the two source pads of the VDMOS 10B, the source pad 11A close to the terminal 25 is connected to the terminal 25 by a wire.

The gate pad and the two source pads of the VDMOS are arranged close to corners of a chip, and because of the above described, the VDMOS 10A, VDMOS 10B and photo electromotive element 15, and the length of the wires connecting the VDMOS 10A, VDMOS 10B and the photo electromotive element 15 can be shortened, and the risk of edge shorts is low. Next, a description will be given of the light emitting side.

As shown in FIG. 2 and FIG. 3, in the bidirectional MOS relay a light emitting element 14 is die bonded to the light emitting side terminal 22. The light emitting element 14 is arranged opposite to the photo electromotive element 15. Transparent resin 19 is formed between the light emitting element 14 and the photo electromotive element 15 so as to transmit light. The area around this transparent resin 19 is covered by epoxy resin 20.

The operation of this bidirectional MOS relay will now be described.

If electrical input current is made to flow in the terminals 21 and 22, the light emitting element 14 will emit light. This light is transmitted to the photo electromotive element 15 through the transparent resin 19. This photo electromotive element 15 has ten photodiodes connected in series using dielectric separation substrate technology, etc., which means that a voltage is generated by exposure to the light.

This voltage is applied to the respective gate pads 12 of the VDMOS 10A and VDMOS 10B through the wires 17 and 18. In this way, the VDMOS 10A and VDMOS 10B turn on, and a conducting state is established between the terminals 24 and 16. If there is no input current at the terminals 21 and 22, there is no light emission, and no voltage generation by the photo electromotive element 15. A charge accumulated in the VDMOS 10A and VDMOS 10B is discharged through a discharge circuit built into the photo electromotive element 15. Thus the VDMOS devices are turned off, and a non-conducting state exists between the terminals 24 and 26.

In the present invention, the gate pad and two source pads of the VDMOS are arranged close to corners of a chip, and because they are wired as described above the wire length can be shortened, and the risk of edge shorts is low. A loop height is also low, which means that a package can be made thin.

Figure 4:
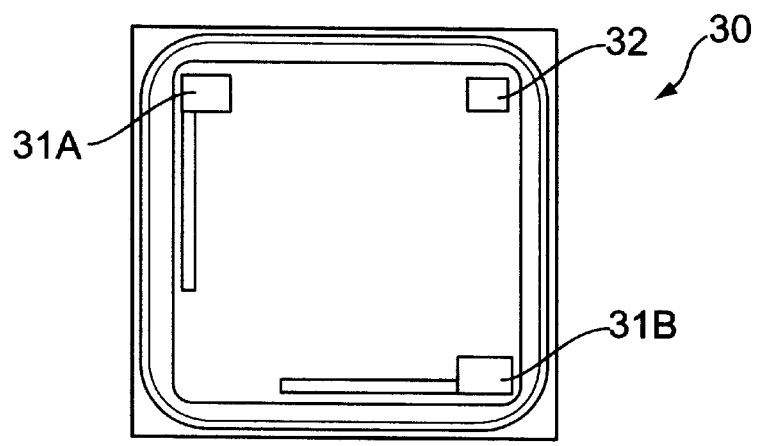
FIG. 4 is a drawing showing a pad pattern of a VDMOS of a second embodiment of the present invention.
Figure 5A:
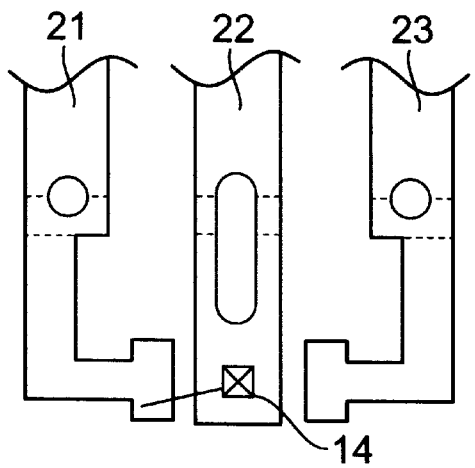
FIG. 5 (a) and FIG. 5 (b) are wiring diagrams of a bidirectional MOS relay using the VDMOS of the second embodiment.
Figure 5B:
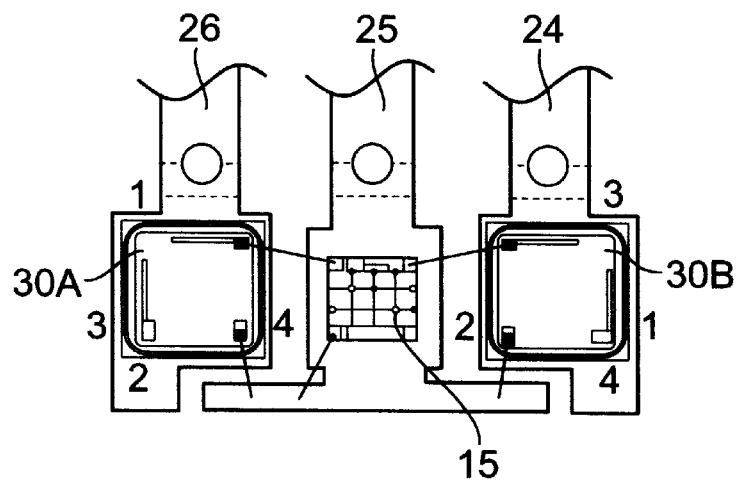

FIG. 4 is a drawing showing a pad pattern of a VDMOS of a second embodiment of the present invention. FIG. 5 (*a*) and FIG. 5 (*b*) are wiring diagrams of a bidirectional MOS relay that uses the VDMOS of the second embodiment. FIG. 5 (*a*) is a wiring diagram of the light emitting side, while FIG. 5 (*b*) is a wiring diagram of the light receiving side. Parts that are the same as parts in the first embodiment have the same reference numerals attached thereto.

The VDMOS pad pattern of the second embodiment will now be described using FIG. 4.

As shown in FIG. 4, the pattern of the VDMOS 30 has a gate pad 31A, a source pad 32 and a gate pad 31B arranged close to three corners. The gate pad 31A and the gate pad 31B are arranged close to two opposite corners of the VDMOS 30. The source pad 32 is arranged close to a corner in between these two corners.

A bidirectional MOS relay that uses the VDMOS of FIG. 4 will now be described using FIG. 5 (*a*) and FIG. 5 (*b*).

The light emitting side element in FIG. 5 (*a*) is the same as that in FIG. 3 (*a*).

A description will be given for the element of the light receiving side.

As shown in FIG. 5 (*b*), in the bidirectional MOS relay that uses this VDMOS, VDMOS 30A (first MOS transistor element) and VDMOS 30B (second MOS transistor element) are respectively die bonded to the two terminals 26 and 24 of the light receiving side, and a photo electromotive element (light receiving element) is die bonded to the terminal 25.

By making two VDMOS 30A and 30B using the same wafer, there is no variation in the directivity at the time of switching.

As shown in FIG. 5 (*a*), the pad pattern of the VDMOS 30A and the pad pattern of the VDMOS 30B are arranged symmetrically with respect to the light emitting element chip. The VDMOS 30A (or the VDMOS 30B) is rotated by 90° with respect to the VDMOS 30B (or the VDMOS 30A), and die bonded. The rotation by 90° and die bonding uses currently known die bonding as much as possible, and not difficult techniques, and can be simply controlled using software.

Each of the source pads of the VDMOS 30A and the VDMOS 30B are arranged so as to be close to the terminal 25. Each of the source pads of the VDMOS 30A and the VDMOS 30B are connected to the terminal 25 by a wire. Of the two gate pads of the VDMOS 30A, the gate pad 31A close (closer) to the photo electromotive element 15 is connected to the photo electromotive element 15 using a wire. Of the two gate pads of the VDMOS 30B, the gate pad 31B close (closer) to the photo electromotive element 15 is connected to the photo electromotive element 15 using a wire. The two gate pads and the source pad of the VDMOS are arranged close to corners of the chip, and are wired as described above, which makes it possible to shorten the length of wires connecting the VDMOS and the photo electromotive element 15, which in turn lowers the risk of edge shorts. Loop height is also low, so the package can be made thin.

Figure 6:
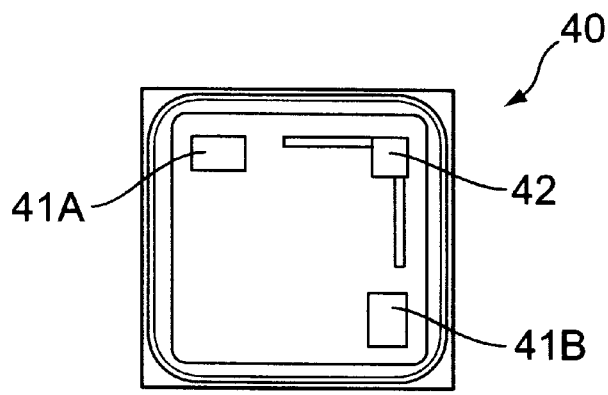
FIG. 6 is a drawing showing a pad pattern of a VDMOS of a third embodiment of the present invention.

FIG. 6 is a drawing showing a pad pattern of VDMOS of a third embodiment of the present invention.

Figure 7A:
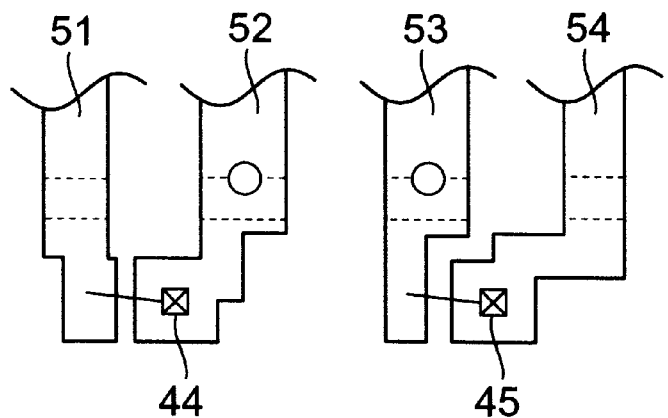
FIG. 7 (a) and FIG. 7 (b) are wiring diagrams of a bidirectional MOS relay using the VDMOS of the third embodiment.
Figure 7B:
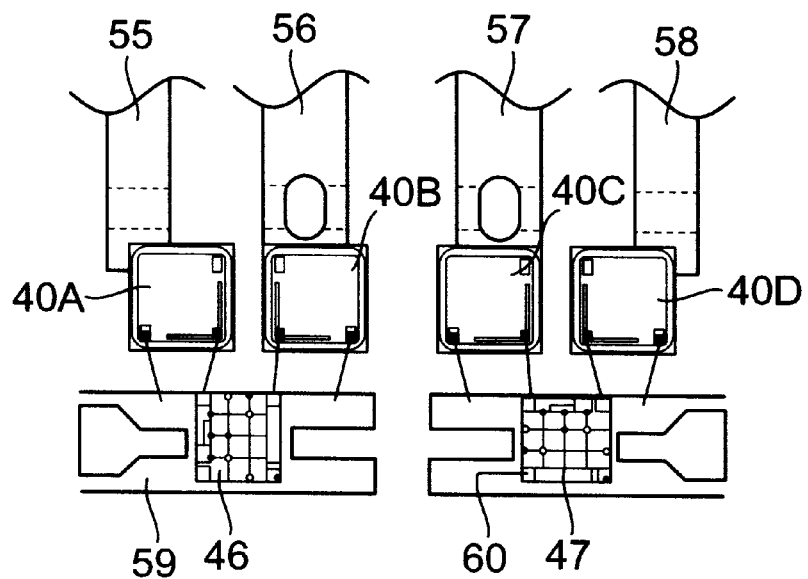

FIG. 7 (*a*) and FIG. 7 (*b*) are wiring diagrams of a bidirectional MOS relay that uses the VDMOS of the third embodiment.

FIG. 7 (*a*) is a wiring diagram of the light emitting side, while FIG. 7 (*b*) is a wiring diagram of the light receiving side.

The VDMOS pad pattern of the third embodiment will now be described using FIG. 6.

As shown in FIG. 6, the pattern of the VDMOS 40 has a source pad 41A, a gate pad 42 and a source pad 41B arranged close to three corners. The source pad 41A and the source pad 41B are arranged close to two opposite corners of the VDMOS 40. The gate pad 42 is arranged close to a corner in between these two corners.

A bidirectional MOS relay that uses the VDMOS of FIG. 6 will now be described using FIG. 7.

In the first and second embodiment, there is a single bidirectional MOS relay. In the third embodiment there are two bidirectional MOS relays.

First of all, the light receiving side element will be described.

As shown in FIG. 7 (*b*), in the bidirectional MOS relay that uses this VDMOS, VDMOS 40A (first MOS transistor element) and VDMOS 40B (second MOS transistor element) are respectively die bonded to the two terminals 55 and 56 of the light receiving side. VDMOS 40C and VDMOS 40D are respectively die bonded to the two terminals 57 and 58 of the light receiving side element. The pad pattern of the VDMOS 40A and the pad pattern of the VDMOS 40B are arranged rotated by 90° with respect to each other. A photo electromotive element 46 is die bonded to the terminal 59. A photo electromotive element 47 is die bonded to the terminal 60.

Each of the gate pads of the VDMOS 40A and VDMOS 40B are arranged so as to be close to the light emitting element. Each of the gate pads of the VDMOS 40A and VDMOS 40B are connected to the photo electromotive element 46 by wires. Of the two source pads of the VDMOS 40A, the source pad 41B close (closer) to the terminal 59 is connected to the terminal 59 by a wire. Of the two source pads of the VDMOS 40B, the source pad close (closer) to the terminal 59 is connected to the terminal 59 by a wire.

Each of the gate pads of the VDMOS 40C and VDMOS 40D are arranged so as to be close to the photo electromotive element 47. Each of the gate pads of the VDMOS 40C and VDMOS 40C are connected to the photo electromotive element 47 by wires. Of the two source pads of the VDMOS 40C, the source pad 41B close (closer) to the terminal 60 is connected to the terminal 60 by a wire. Of the two source pads of the VDMOS 40D, the source pad close (closer) to the terminal 60 is connected to the terminal 60 by a wire.

At the light emitting side, as shown in FIG. 7 (*a*), light emitting element 44 and light emitting element 45 are respectively arranged on the terminal 52 and the terminal 54. The light emitting element 44 and the terminal 50 are connected by a wire, and the light emitting element 45 and the terminal 53 are also connected by a wire.

In the third embodiment, the gate pad and the two source pads of the VDMOS are arranged close to corners of the chip and are wired as described above, which means that the length of wires connecting the VDMOS 40A, VDMOS 40B, VDMOS 40C VDMOS 40D and the photo electromotive element 15 is shortened and the risk of edge shorts is low. Loop height is also low, so the package can be made thin.

In the first and second embodiments, a description has been given of a normally open type bidirectional MOS relay that uses enhancement type VDMOS devices. The first embodiment and the second embodiment can also be applied to a normally open type bidirectional MOS relay that uses depletion type VDMOS.

Further, in the third embodiment, normally open type and normally closed type VDMOS devices can be used in combination.

The VDMOS shown in FIG. 4 can also be used in the third embodiment.

The above-described embodiments have been described using VDMOS examples, but can also be applied to horizontal MOSFETs.

The present invention has been described using illustrative embodiments, but this description is hot intended to be construed in a limiting sense. Various modifications to these embodiments, and other embodiments, will be apparent to one skilled in the art upon reference to this description. Accordingly, the attached claims are intended to cover all such modifications and embodiments that fall within the spirit and scope of the present invention.

What is claimed is:

1. A semiconductor device, comprising:
   a first terminal;
   a light emitting element arranged on the first terminal;
   a second terminal;
   a light receiving element arranged on the second terminal opposite said light emitting element;
   a third terminal;
   a fourth terminal;
   a first MOS transistor element arranged on said third terminal and having a first pad pattern, including
      two source pads arranged in the vicinity of two first diagonally opposite corners of said first MOS transistor element, and
      a first gate pad arranged in the vicinity of a corner of said first MOS transistor element in between said two first opposite corners;
   a second MOS transistor element arranged on said fourth terminal and having a second pad pattern, including
      two source pads arranged in the vicinity of two second diagonally opposite corners of said second MOS transistor element, and
      a second gate pad arranged in the vicinity of a corner of said second MOS transistor element in between said two second opposite corners, wherein said first MOS transistor element and said second MOS transistor element are arranged so that said first Dad pattern of said first MOS transistor element and said second pad pattern of said second MOS transistor element are symmetrical with respect to said light receiving element;
   a plurality of wires respectively connecting the first and second gate pads of said first and said second MOS transistors to the light receiving element;
   a wire connecting one of the two source pads of said first MOS transistor element, that is closer to said second terminal, to said second terminal;
   a wire connecting one of the two source pads of said second MOS transistor element, that is closer to said second terminal, to said second terminal, to said second terminal; and
   a wire connecting the light receiving element and said second terminal.

2. The semiconductor device as disclosed claim 1, wherein said light receiving element is arranged between said first MOS transistor element and said second MOS transistor element.

3. The semiconductor device as disclosed in claim 1, wherein the first and second gate pads respectively of said first MOS transistor element and said second MOS transistor are arranged so that the plurality of wires respectively connecting the first and second gate pads respectively of said first and said second MOS transistor element to said light receiving element are shortened.

4. A semiconductor device, comprising:
   a first terminal;
   a light emitting element arranged on the first terminal;
   a second terminal;
   a light receiving element arranged on the second terminal opposite said light emitting element;
   a third terminal;
   a fourth terminal;
   a first MOS transistor element arranged on said third terminal and having a first pad pattern, including
      two gate pads arranged in the vicinity of two first diagonally opposite corners of said first MOS transistor element, and
      a first source pad arranged in the vicinity of a corner of said first MOS transistor element in between said two first opposite corners;
   a second MOS transistor element arranged on said fourth terminal and having a second pad pattern, including two gate pads arranged in the vicinity of two second diagonally opposite corners of said second MOS transistor element, and a second source pad arranged in the vicinity of a corner of second MOS transistor element in between said two second opposite corners, wherein said first MOS transistor element and said second MOS transistor element are arranged so that said first pad pattern of said first MOS transistor element and said second pad pattern of said second MOS transistor element are symmetrical with respect to said light receiving element;

a plurality of wires respectively connecting one of the two gate pads of each of said first and said second MOS transistors, that is closer to said light receiving element to the light receiving element;

a wire connecting the first source pad of said first MOS transistor element to said second terminal;

a wire connecting the second source pad of said second MOS transistor element to said second terminal; and a wire connecting said light receiving element and said second terminal.

5. The semiconductor device as disclosed in claim 4, wherein said light receiving element is arranged between said first MOS transistor element and said second MOS transistor element.

6. The semiconductor as disclosed in claim 4 wherein the two gate pads of said first MOS transistor element and the two gate pads of said second MOS transistor element are arranged so that the plurality of wires respectively connecting one of the two gate pads of each of said first MOS transistor element and said second MOS transistor element to said light receiving element are shortened.

* * * * *